(12) United States Patent
Strmiska et al.

(10) Patent No.: US 7,075,791 B2
(45) Date of Patent: Jul. 11, 2006

(54) METHOD AND APPARATUS FOR SECURING AND RELEASING A CHASSIS COMPONENT

(75) Inventors: Bernard Strmiska, Hutto, TX (US);
Russell Smith, Pflugerville, TX (US);
Brandon Brocklesby, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/901,569

(22) Filed: Jul. 29, 2004

(65) Prior Publication Data

US 2006/0023427 A1 Feb. 2, 2006

(51) Int. Cl.
*H05K 5/03* (2006.01)

(52) U.S. Cl. .................. 361/727; 312/223.2; 248/917; 345/905

(58) Field of Classification Search ........ 361/679–687, 361/724–727; 312/223.2–223.6; 248/917; 335/202; 431/153; 345/169, 905
See application file for complete search history.

(56) References Cited

U.S. PATENT DOCUMENTS

| | | | | |
|---|---|---|---|---|
| 5,603,535 | A | 2/1997 | Antonucci et al. | 434/473 |
| 6,023,953 | A | 2/2000 | Vickers et al. | 170/208 |
| 6,137,386 | A * | 10/2000 | Mueller | 335/202 |
| 6,178,086 | B1 * | 1/2001 | Sim et al. | 361/683 |
| 6,297,948 | B1 * | 10/2001 | Buican et al. | 361/683 |
| 2004/0023178 | A1 * | 2/2004 | Sgroi et al. | 431/153 |

* cited by examiner

*Primary Examiner*—Hung Van Duong
(74) *Attorney, Agent, or Firm*—Haynes and Boone, LLP

(57) ABSTRACT

An apparatus for securing and releasing a chassis component is provided that includes a latch including a beveled surface, the latch operable to translate along an axis. A first resilient member is coupled to the latch, the first resilient member operable to bias the latch in a latching position along the axis. A second resilient member is coupled to the latch and adjacent the beveled surface, whereby upon a first translating motion of the latch the second resilient member is moved to a retaining position, and upon a second translating motion of the latch the second resilient member is moved to a release position.

17 Claims, 11 Drawing Sheets

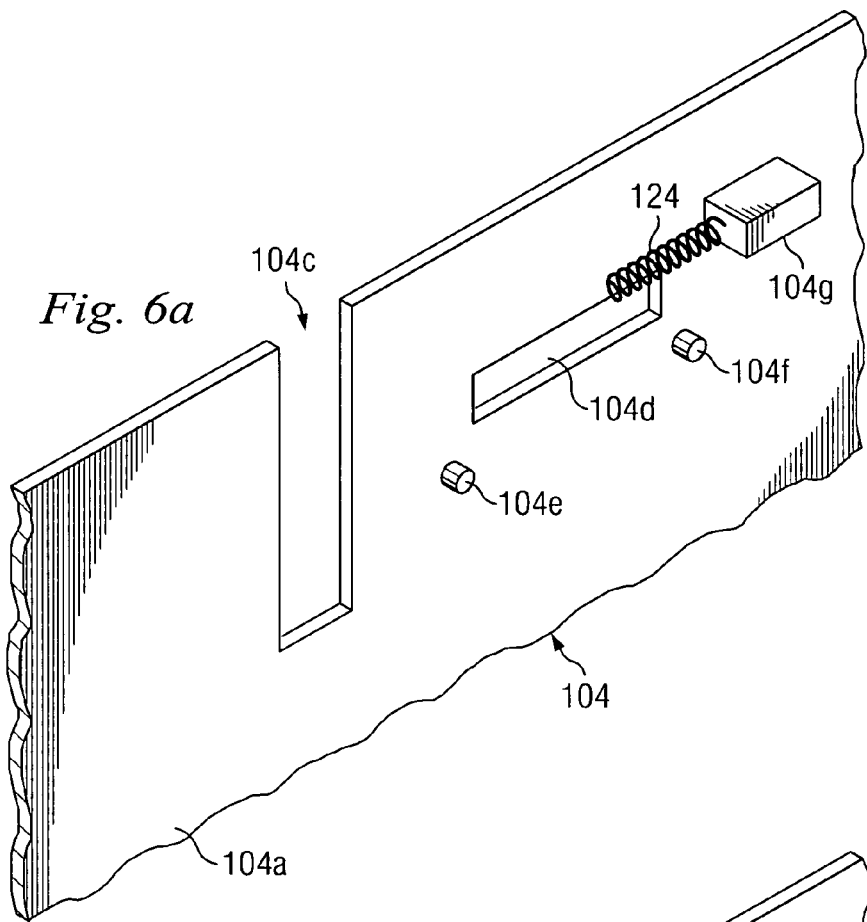
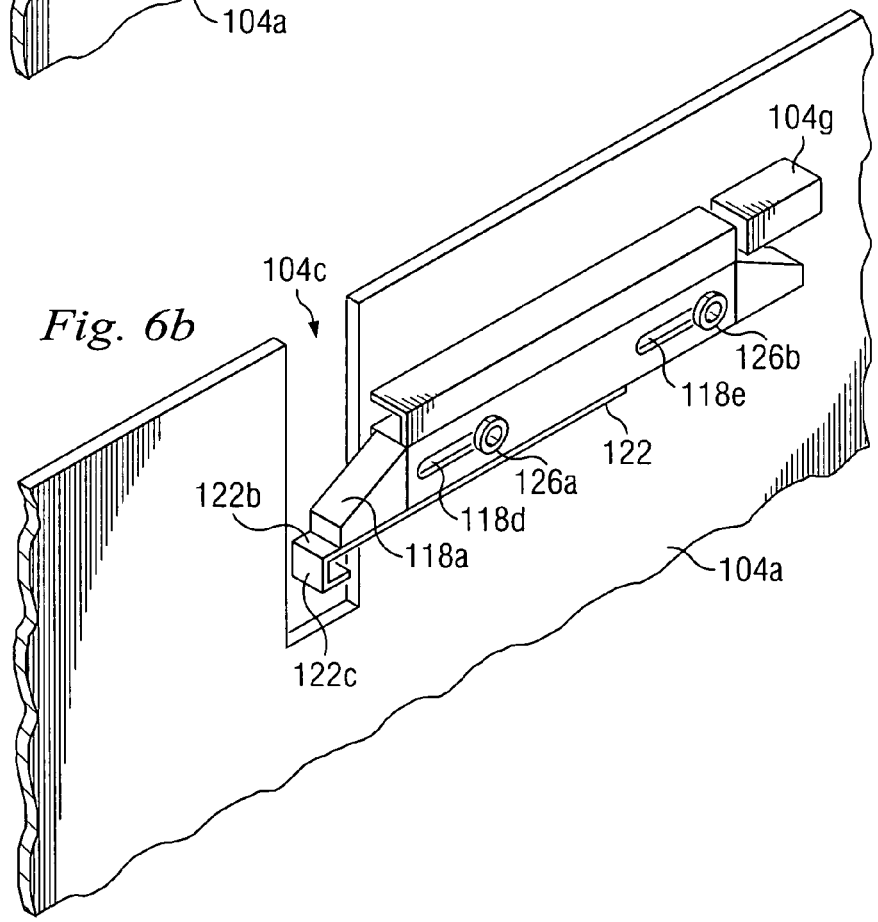

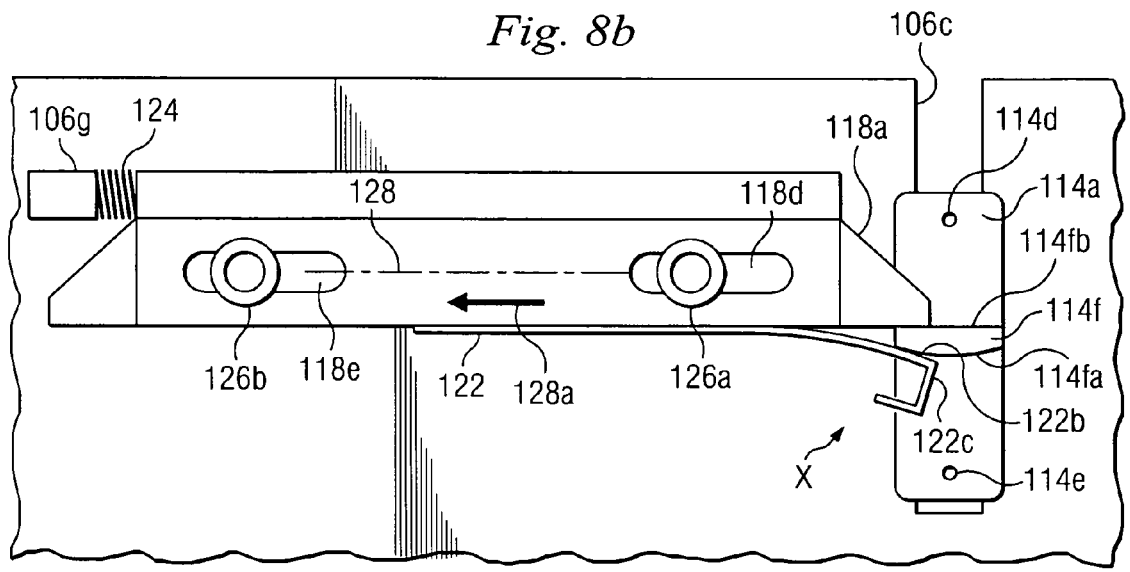
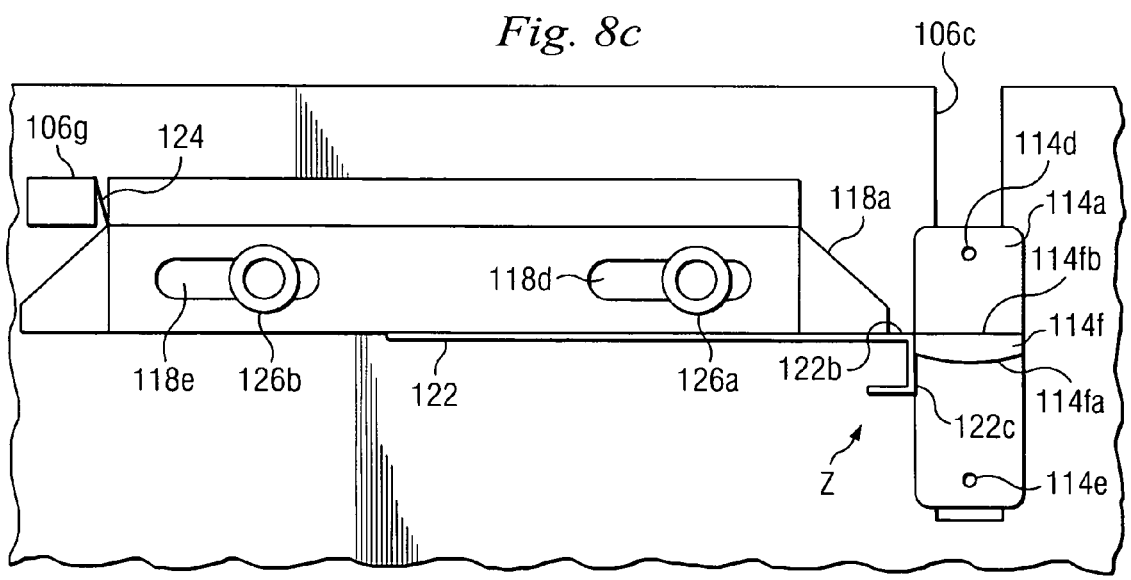

METHOD AND APPARATUS FOR SECURING AND RELEASING A CHASSIS COMPONENT

BACKGROUND

The present disclosure relates generally to information handling systems, and more particularly to a method and apparatus for securing and releasing a chassis component used with an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are generally situated in a chassis. The chassis may include a variety of removable chassis components that provide for the installation and support of components of the information handling system and for support to the chassis itself. These chassis components may be removable to allow access to the information handling system components.

The removable chassis components can include large cross braces that may span the chassis and be latched into the chassis. Due to layout constraints, these large braces are dropped straight down into the chassis, resulting in the need for latching each side of the brace to the chassis in order to retain the brace in the chassis. Brace removal is then accomplished by a user actuating both of the latches with each hand and simultaneously removing the brace from the chassis. Such an operation requires the use of both hands and immediate removal of the brace once it is unlatched.

Due to design constraints on some information handling systems, there may be no comfortable, ergonomic design that allows a user to simultaneously actuate the latches and remove the brace. The user may also need to be able to release the latches and remove the brace with the use of one hand, or release the brace without immediately removing it.

Accordingly, it would be desirable to provide for securing and releasing a chassis component in an information handling system absent the disadvantages found in the prior methods discussed above.

SUMMARY

According to one embodiment, securing and releasing a chassis component is accomplished by providing a latch including a beveled surface, the latch operable to translate along an axis, a first resilient member coupled to the latch, the first resilient member operable to bias the latch in a latching position along the axis, and a second resilient member coupled to the latch and adjacent the beveled surface, whereby upon a first translating motion of the latch the second resilient member is moved to a retaining position, and upon a second translating motion of the latch the second resilient member is moved to a release position.

A principal advantage of this embodiment is that a chassis component may be released from a chassis without having to be simultaneously removed from the chassis.

BRIEF DESCRIPTION OF THE DRAWINGS

FIG. 4b is a side view illustrating an embodiment of the guide of FIG. 4a.

FIG. 4c is a rear perspective view illustrating an embodiment of the guide of FIG. 4a.

FIG. 5b is a side view illustrating an embodiment of the latch of FIG. 5a.

FIG. 6a is a perspective view illustrating an embodiment of a biasing resilient member coupled to the chassis of FIG. 2.

FIG. 6b is a perspective view illustrating an embodiment of the latch of FIG. 5a coupled to the chassis of FIG. 2.

FIG. 8b is a side view illustrating an embodiment of the latch of FIG. 5a on the chassis of FIG. 6c disengaging the guide of FIG. 4a.

FIG. 8c is a side view illustrating an embodiment of the guide of FIG. 4a released from the latch of FIG. 5a on the chassis of FIG. 6c.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
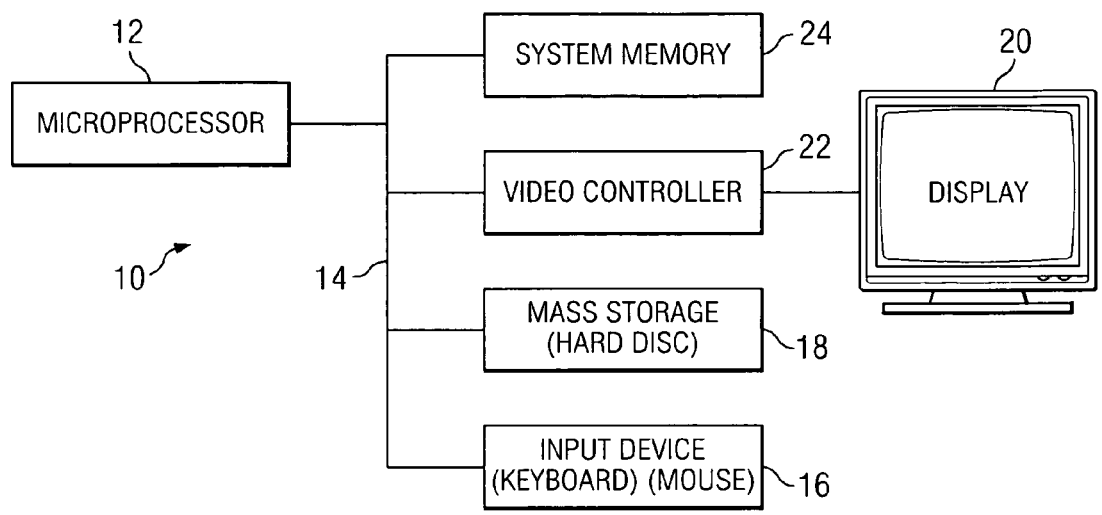
FIG. 1 is a schematic view illustrating an embodiment of an information handling system.
Figure 3:
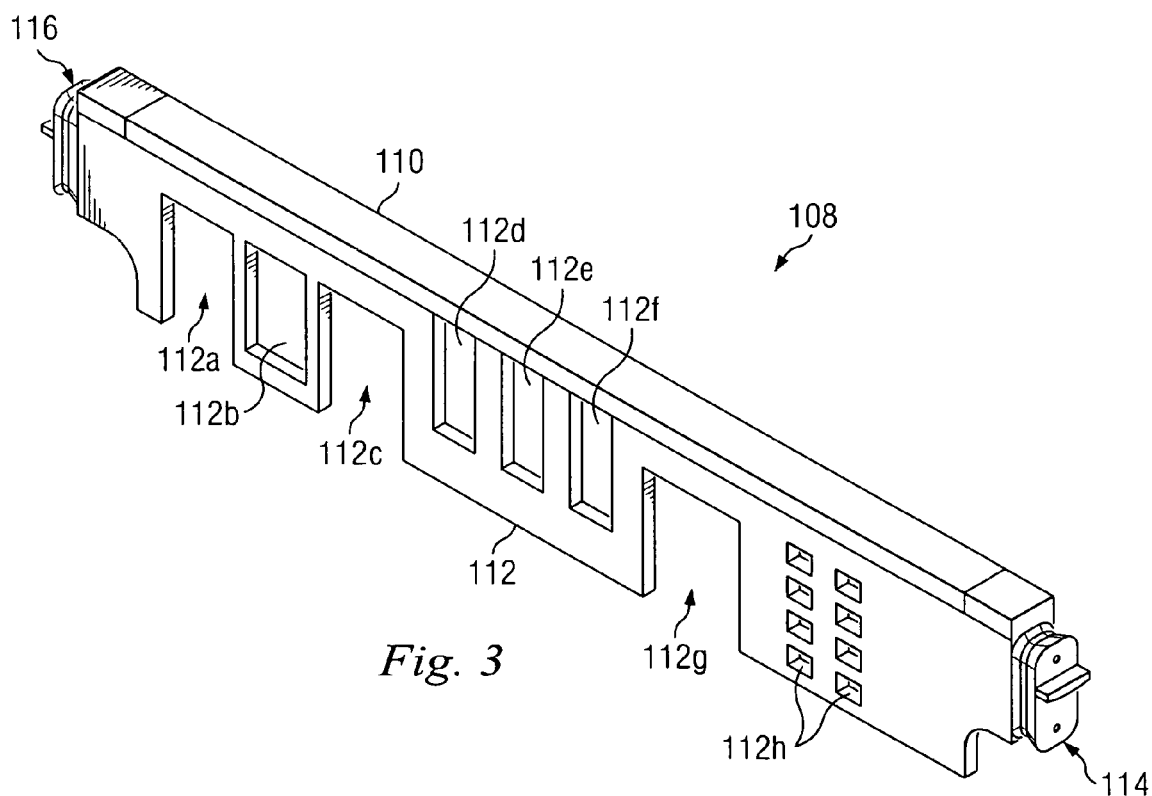
FIG. 3 is a perspective view illustrating an embodiment of a chassis component used with the chassis of FIG. 2.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
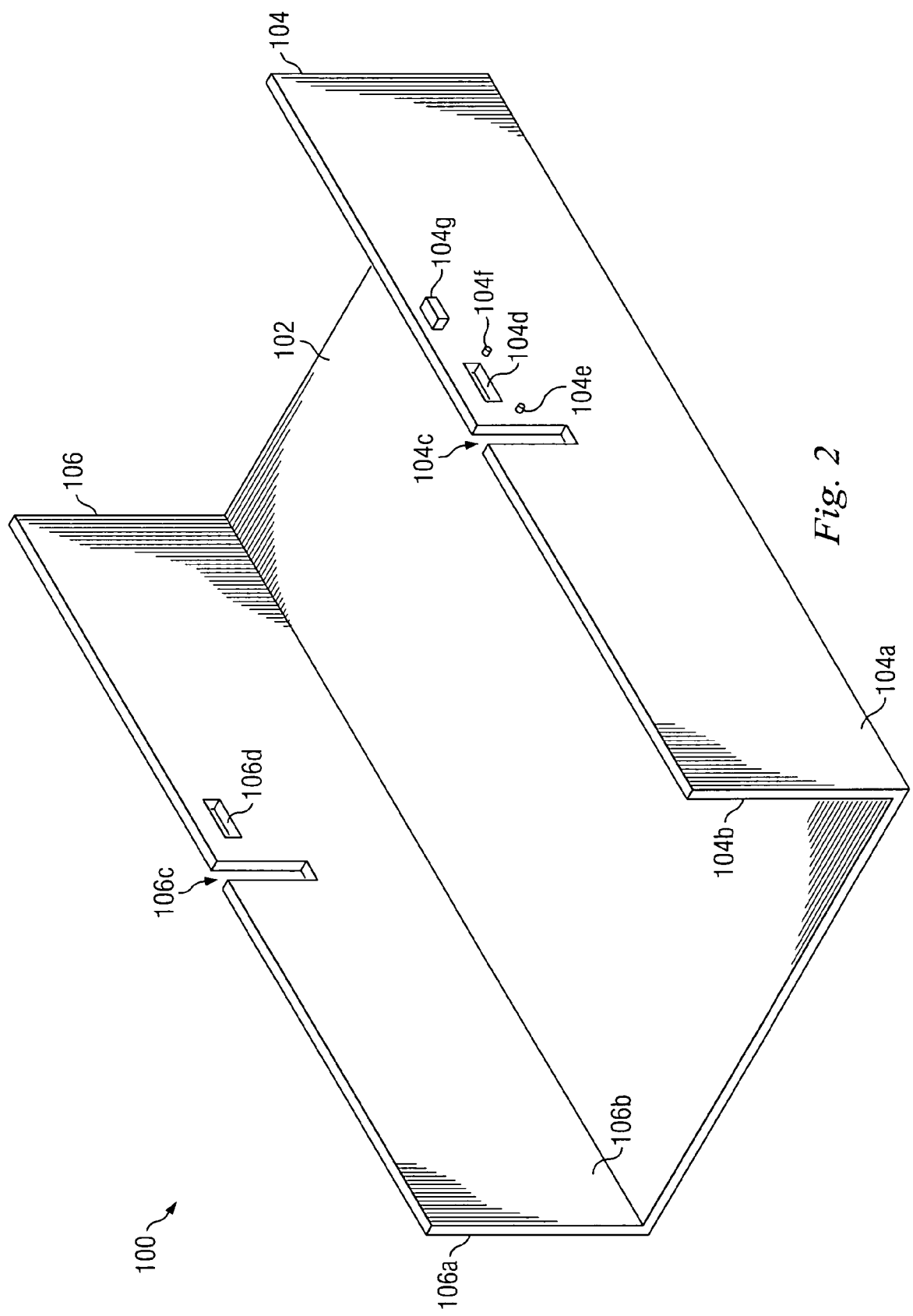
FIG. 2 is a perspective view illustrating an embodiment of a chassis for housing some or all of the information handling system of FIG. 1.
Figure 4C:
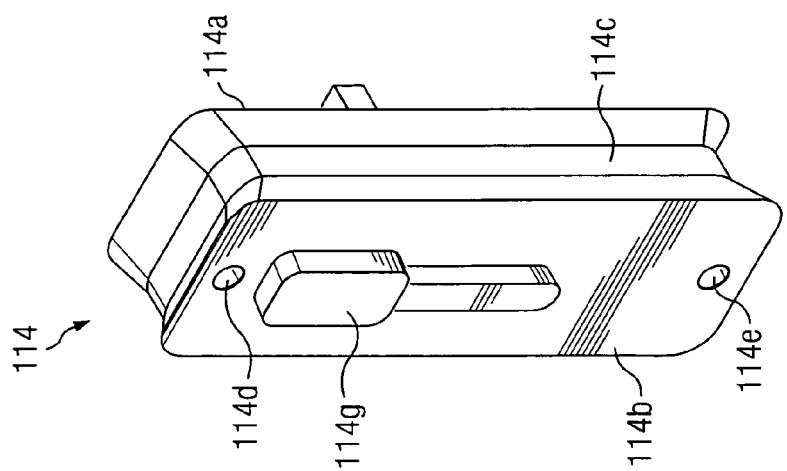
Figure 4B:
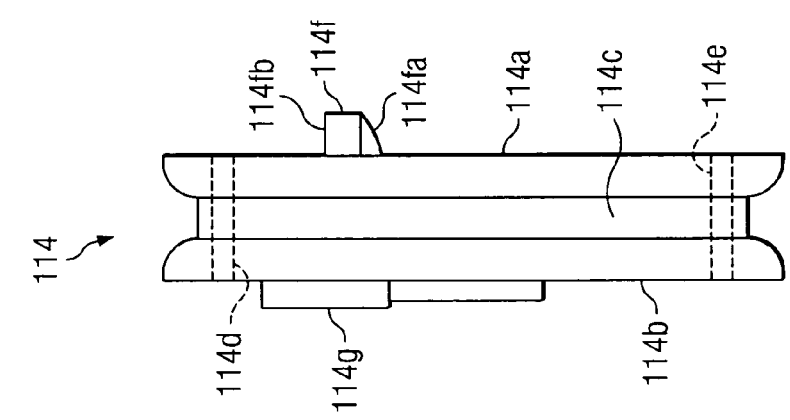
Figure 4A:
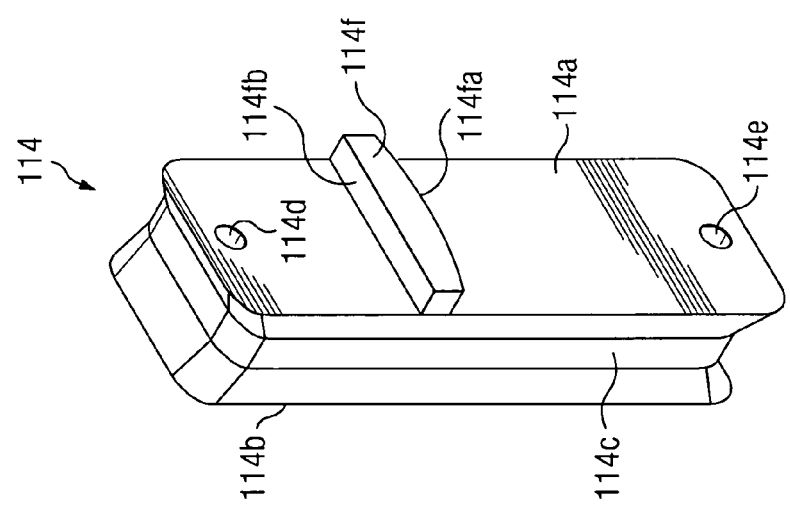
FIG. 4a is a front perspective view illustrating an embodiment of a guide used with the chassis component of FIG. 3.

Referring now to FIG. 2, a chassis 100 may be included for housing some or all of the components of information handling system 10, illustrated in FIG. 1. Chassis 100 includes a base 102 and a pair of walls 104 and 106 situated on opposite sides of the base 102 and extending substantially perpendicular from the base 102 and parallel to each other. Wall 104 includes an outer surface 104a and an inner surface 104b opposite the outer surface 104a. Wall 104 defines a component channel 104c extending from an upper edge of the wall 104 and substantially perpendicular to the base 102. Wall 104 also defines a handle channel 104d situated adjacent to and substantially perpendicular to the component channel 104c. A pair of latch supports 104e and 104f extend from the wall 104 and are situated adjacent to and on opposite sides of the handle channel 104d. A biasing support 104g extends from the wall 104 and is situated adjacent the handle channel 104d. Wall 106 is substantially similar to the wall 104 and includes an outer surface 106a, inner surface 106b, component channel 106c, handle channel 106d, latch supports 106e and 106f (not illustrated), and a biasing support 106g (not illustrated).

Referring now to FIGS. 3, 4a, 4b, and 4c, a chassis component 108 includes a beam 110. A support plate 112 extends from and is situated along the length of the beam 110. The plate 112 defines a plurality of support channels 112a, 112b, 112c, 112d, 112e, 112f, 112g, and 112h along its length. A plurality of guides 114 and 116 are coupled the beam 110 and the plate 112 on each end of the chassis component 108. The guide 114 includes a front surface 114a and a rear surface 114b situated opposite the front surface 114a. The guide 114 defines a guide channel 114c extending around the perimeter of the guide 114 and situated between the front surface 114a and the rear surface 114b. The guide 114 also defines a plurality of mounting holes 114d and 114e situated adjacent each end of the guide 114 and extending from the front surface 114a through the guide 114 to the rear surface 114b. The guide 114 is coupled to the chassis component 108 through the mounting holes 114d and 114e. A catch 114f extends from the front surface 114a and includes an arcuate end 114fa and a flat end 114fb. A locating key 114g extends from the rear surface 114b and may ensure that the guide is not mounted to the chassis component 108 in the wrong orientation. The guide 116 is substantially similar to the guide 114.

Figure 5A:
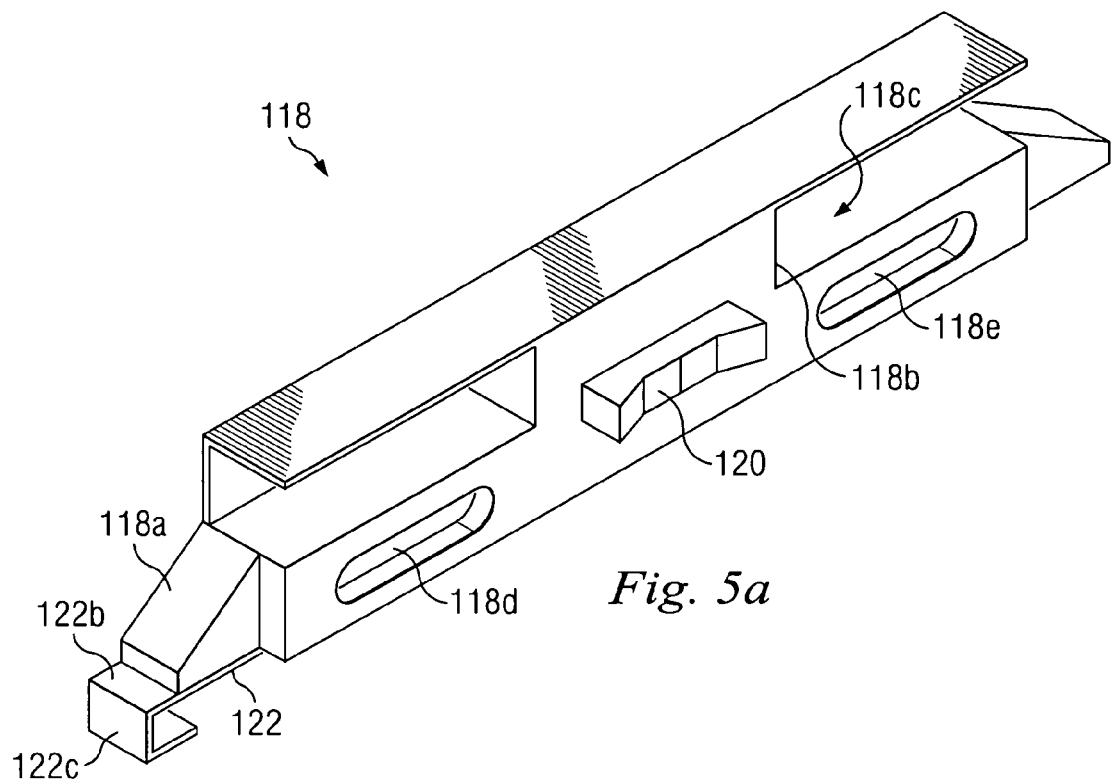
FIG. 5a is a perspective view illustrating an embodiment of a latch used on the chassis of FIG. 2.
Figure 5B:
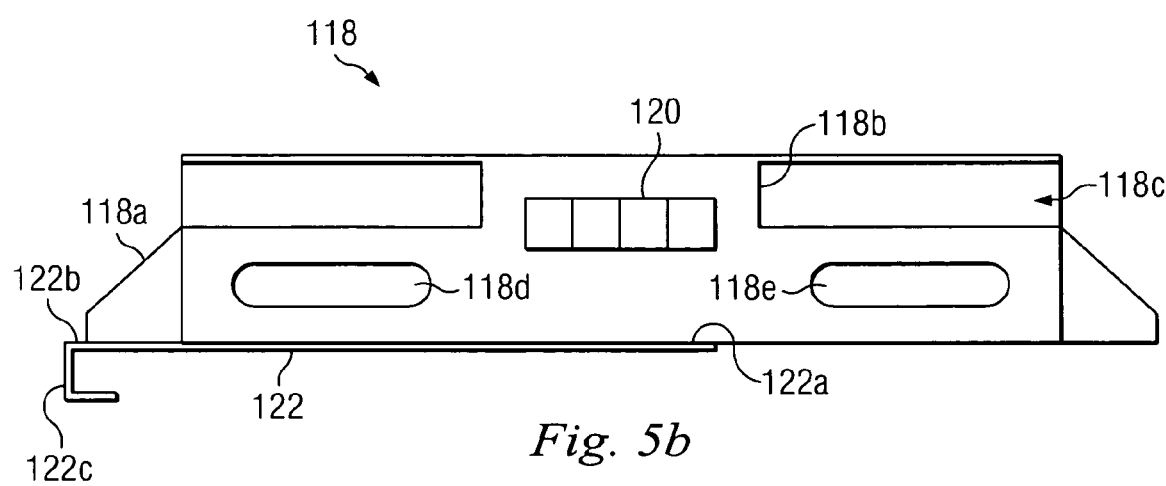

Referring now to FIGS. 5a and 5b, a latch 118 includes a beveled surface 118a extending from an end of the latch 118. The latch 118 includes a biasing surface 118b and defines a biasing channel 118c extending from the biasing surface 118b to an end of the latch 118. The latch 118 also defines a plurality of translation holes 118d and 118e situated each side of the latch 118. A handle 120 extends from the latch 118 and is situated between the translation holes 118d and 118e. A securing resilient member 122 is coupled to a midpoint 122a of the latch 118 and sits adjacent the beveled surface 118a. The securing resilient member 122 includes an activation surface 122b adjacent to and extending out from the end of the latch 118 including the beveled surface 118a. A release surface 122c is provided on the securing resilient member 122 substantially perpendicular to the activation surface 122b. In an exemplary embodiment, the securing resilient member 122 may be a leaf spring. In an exemplary embodiment, the latch 118 may be manufactured symmetrically, as illustrated, such that reorientation of the securing resilient member 122 allows the latch 118 to include the features described above in different orientations.

Figure 6C:
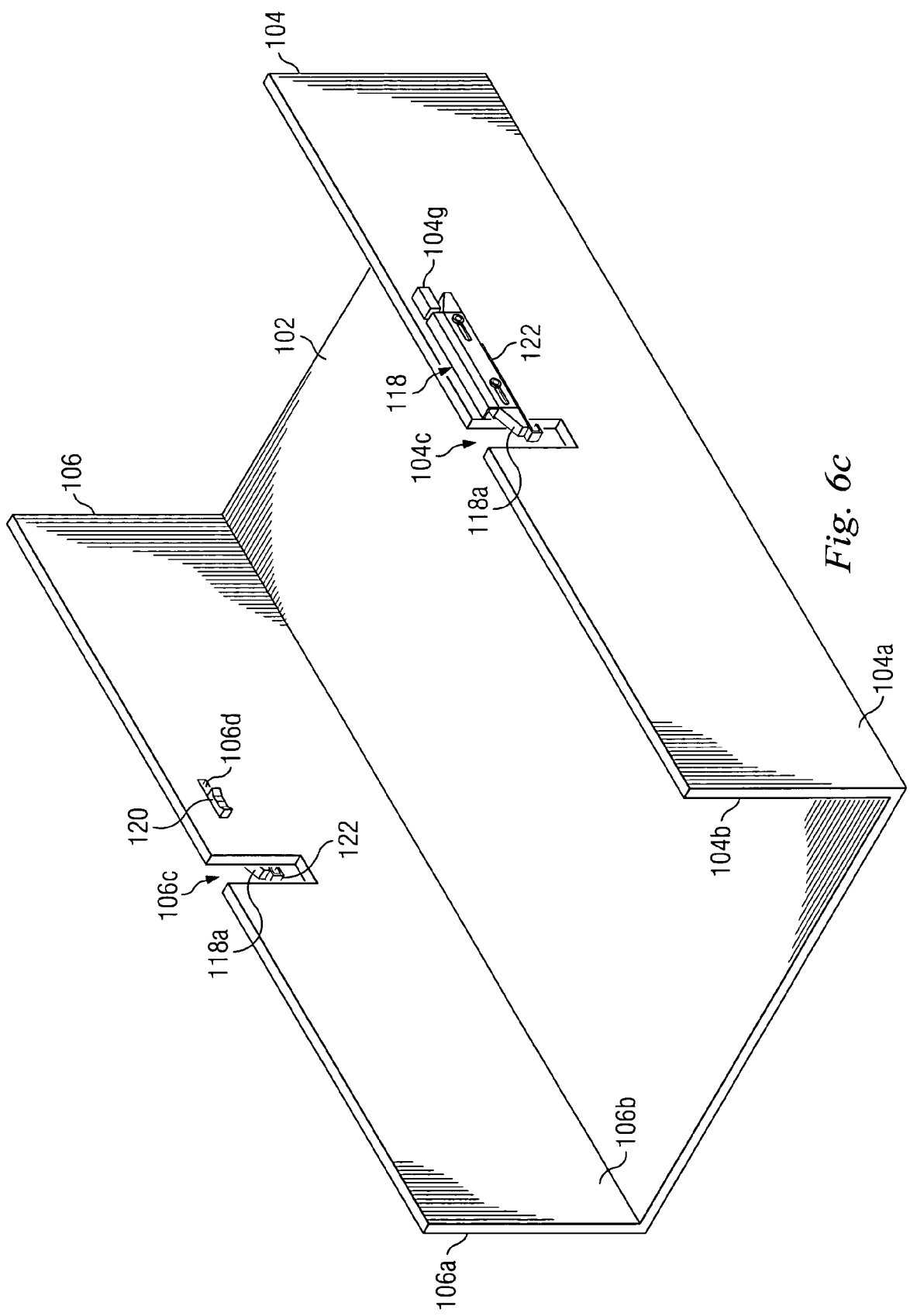
FIG. 6c is a perspective view illustrating an embodiment of a plurality of latches coupled to the chassis of FIG. 2.
Figure 7A:
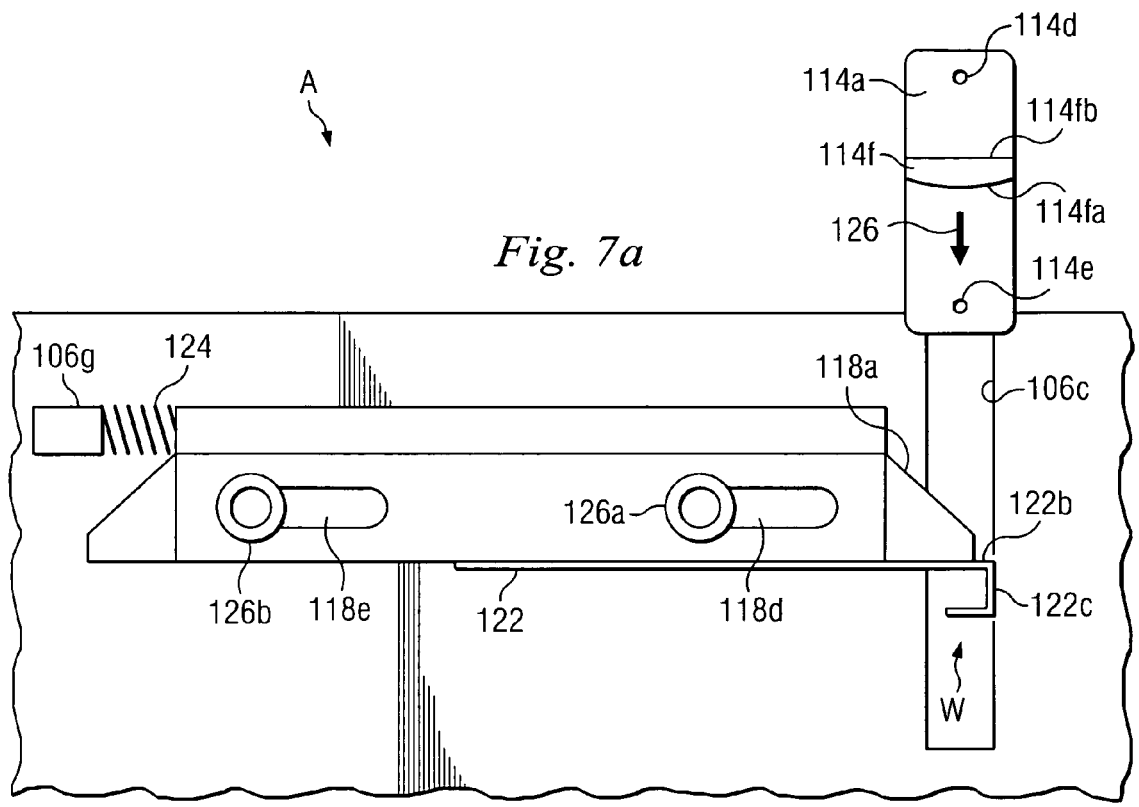
FIG. 7a is a side view illustrating an embodiment of the guide of FIG. 4a entering the chassis of FIG. 6c.
Figure 7B:
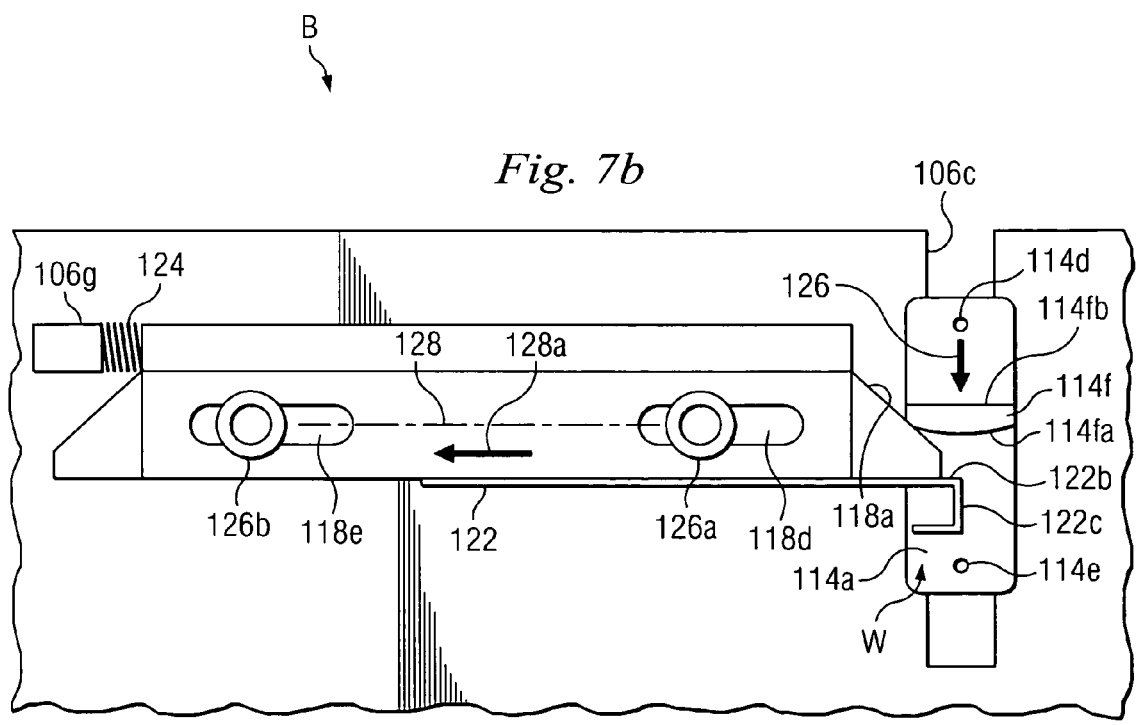
FIG. 7b is a side view illustrating an embodiment of the guide of FIG. 4a engaging the latch of FIG. 5a on the chassis of FIG. 6c.
Figure 7C:
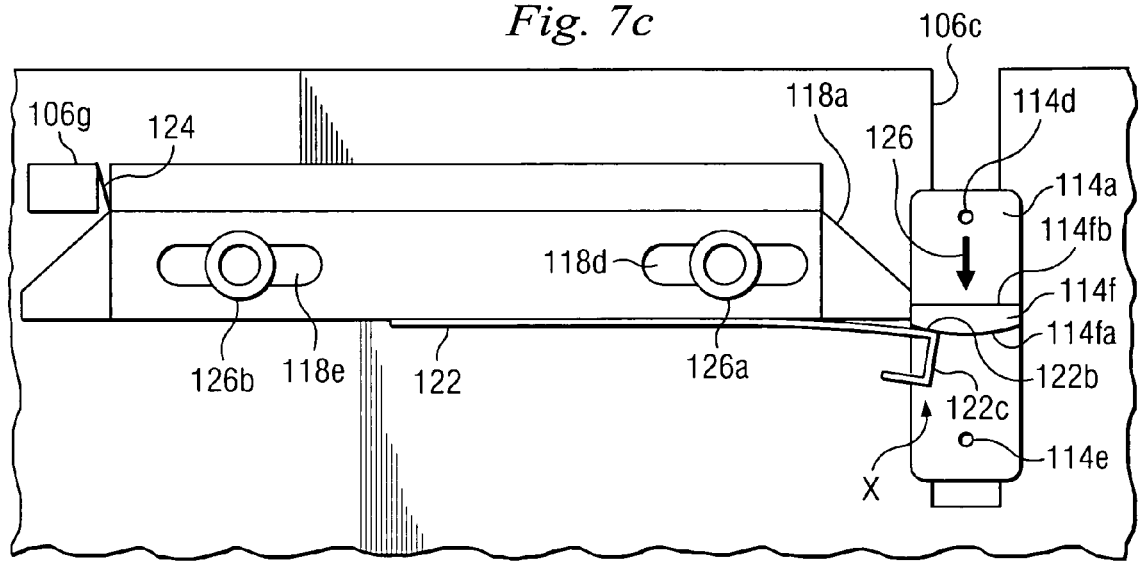
FIG. 7c is a side view illustrating an embodiment of the guide of FIG. 4a engaging the resilient member on the latch of FIG. 5a on the chassis of FIG. 6c.
Figure 7D:
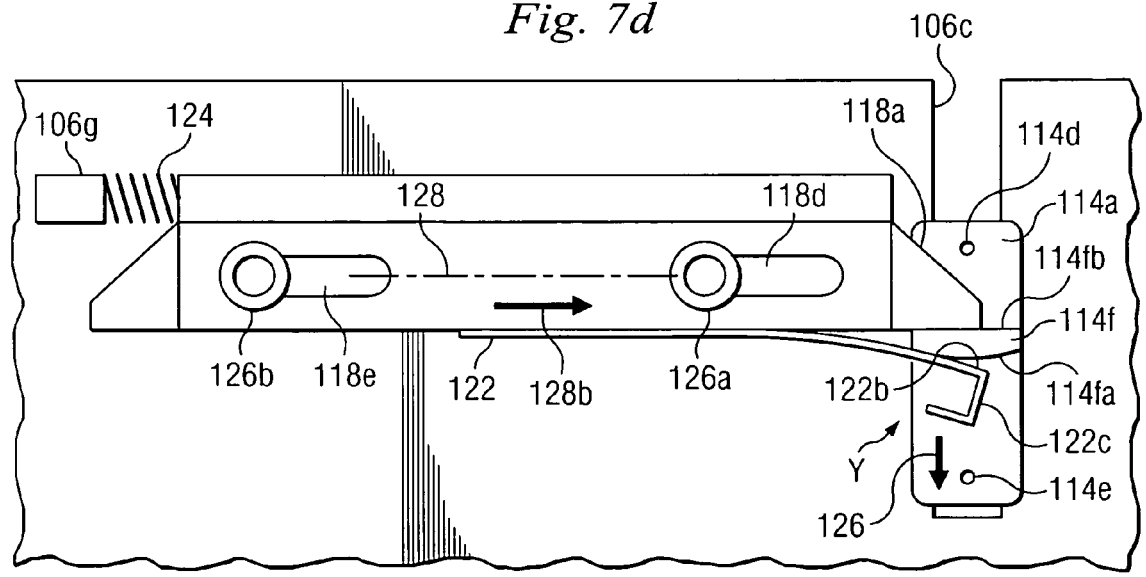
FIG. 7d is a side view illustrating an embodiment of the guide of FIG. 4a secured in the latch of FIG. 5a on the chassis of FIG. 6c.
Figure 8A:
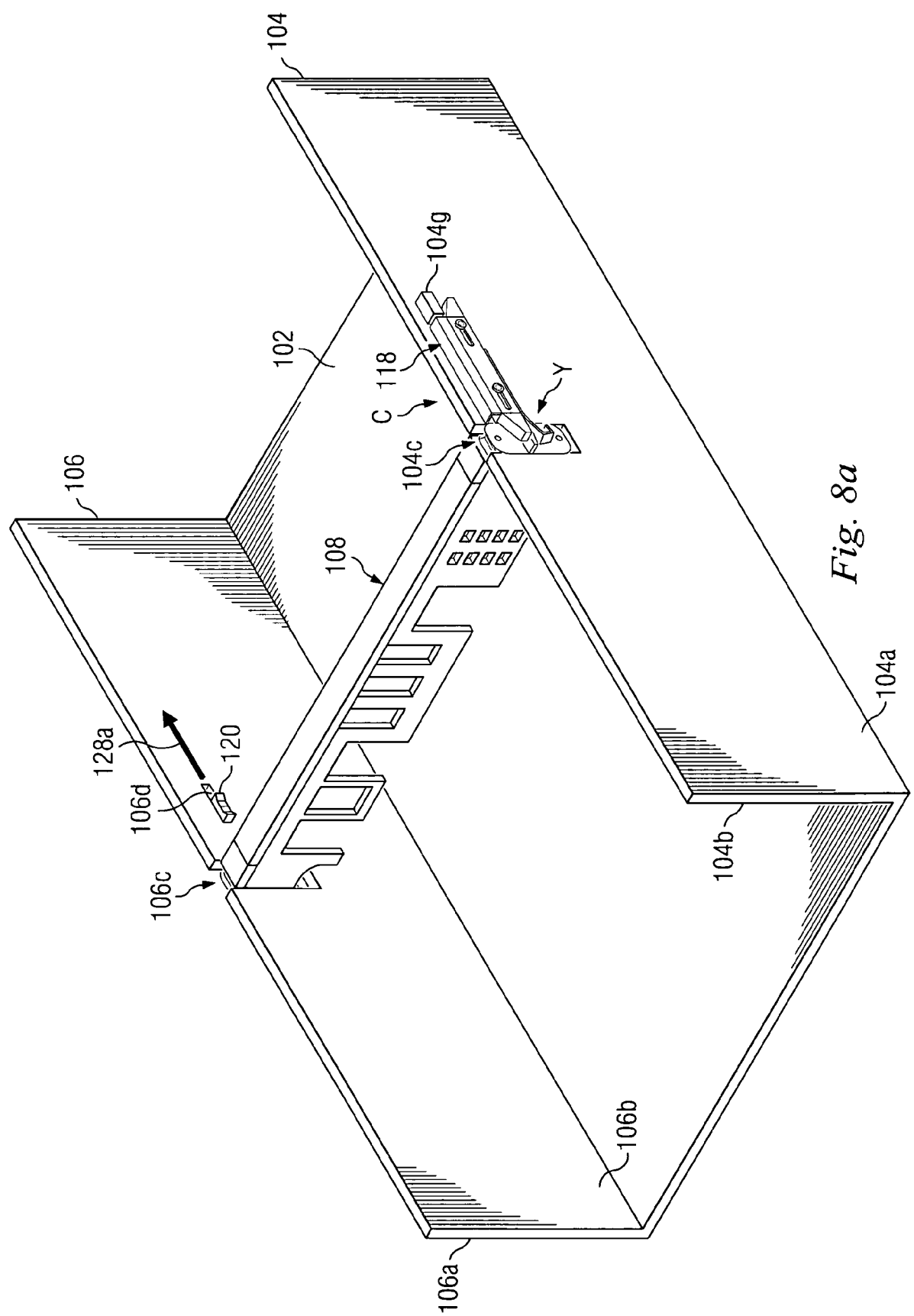
FIG. 8a is a perspective view illustrating an embodiment of the chassis component of FIG. 3 secured in the chassis of FIG. 6c.
Figure 8D:
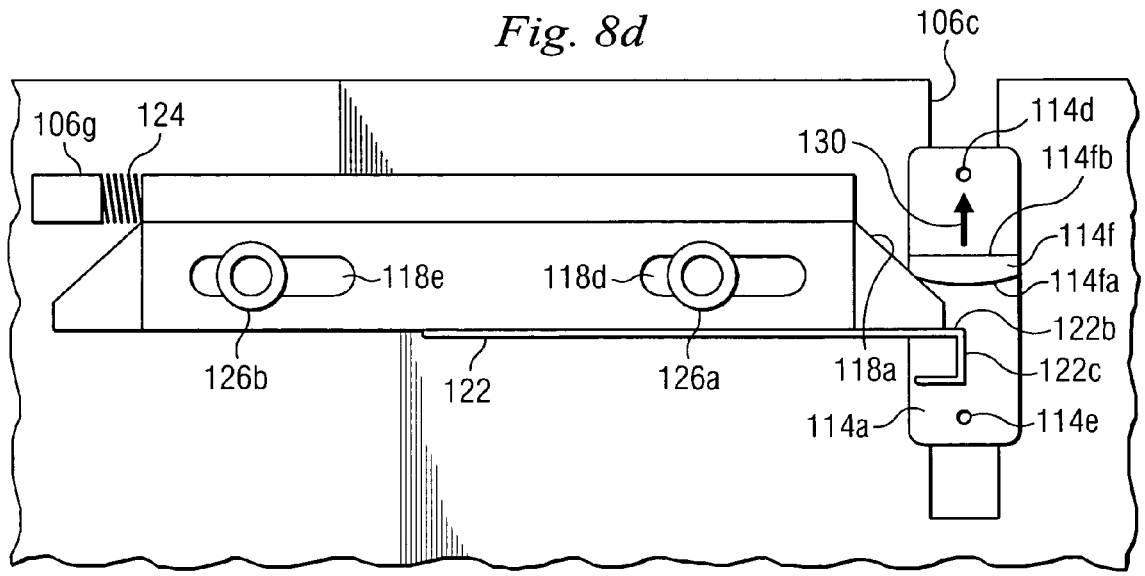
FIG. 8d is a side view illustrating an embodiment of the guide of FIG. 4a disengaging the latch of FIG. 5a and the chassis of FIG. 6c.
Figure 8E:
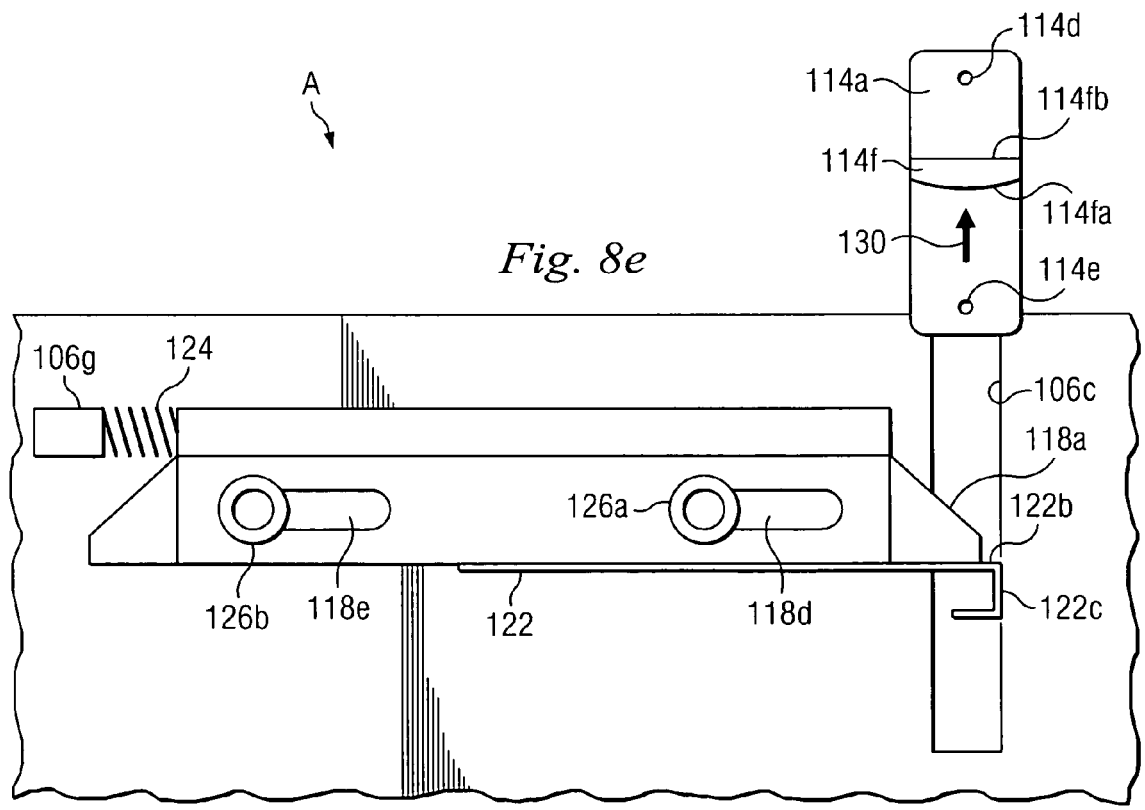
FIG. 8e is a side view illustrating an embodiment of the guide of FIG. 4a disengaging the chassis of FIG. 6c.

Referring now to FIGS. 5a, 5b, 6a, 6b, and 6c, in assembly, a biasing resilient member 124 is coupled to the biasing support 104g. In an exemplary embodiment, the biasing resilient member 124 may be a coil spring. The latch 118 is then coupled to the outer surface 104a of wall 104 on chassis 100 by first placing the biasing resilient member 124 in the biasing channel 118c and the handle 120 in the handle channel 104d. Latch supports 104e and 104f are lined up with the translation holes 118d and 118e, respectively, and retention caps 126a and 126b are placed on the latch supports 104 and 104f. With the retention caps 126a and 126b in place the latch 118 is coupled to the wall 104, and biasing resilient member 124 engages biasing surface 118b resulting in the beveled surface 118a and the securing resilient member 122 being biased into an area adjacent the component channel 104c. Handle 120 extends through handle channel 104d and out from inner surface 104b on chassis 100. A second latch 118 is then coupled to the outer surface 106a of wall 106 on chassis 102 in the same manner such that the beveled surface 118a and the securing resilient member 122 are biased into an area adjacent the component channel 106c and the handle 120 extends through handle channel 106d and out from inner surface 106b on chassis 100, as illustrated in FIG. 6c.

Referring now to FIGS. 2, 3, 4a, 4b, 4c, 5a, 5b, 6a, 6b, 6c, 7a, 7b, 7c, a 7d, in securing operation, the latches 118 begin biased in a latching position A due to the contact of the biasing resilient member 124 and the biasing wall 118b on latch 118. Latching position A situates beveled surface 118a and the securing resilient member 122 into an area adjacent the component channels 104c and 106c, with the securing resilient member 122 situated in a position W. Chassis component 108 with guides 114 and 116 on opposite ends is brought towards the chassis and the guides 114 and 116 are lined up with the component channels 104c and 106c. Operation of the latches is substantially identical and will be described with respect to the latch 118 biased into the component channel 106c and interacting with guide 114. The guide channel 114c on the perimeter of guide 114 is engaged with the component channel 106c such that the guide 114 becomes located in the component channel 106c. The guide 114 is then translated in a direction 126 through the component channel 106c until the arcuate end 114fa of catch 114f engages beveled surface 118a on latch 118. Further translation of the guide 114 in direction 126 through the component channel 106c will cause the latch 118 to translate along an axis 128 and in a direction 128a that is substantially perpendicular to the direction 126, and result in the latch 118 being situated in an intermediate position B, compressing biasing resilient member 124 between the biasing support 106g and the biasing wall 118b. Further translation of the guide 114 in direction 126 will cause arcuate end 114fa of catch 114f to disengage beveled surface 118a of latch 118 and engage activation surface 122b of securing resilient member 122, resulting in securing resilient member 122 being situated in an intermediate position X, deflected away from the beveled surface 118a on latch 118. Further translation of guide 114 in direction 126 will allow latch 118 to translate in a direction 128b along axis 128, which is opposite direction 128a, due to the biasing force provided by biasing resilient member 124. When latch 118 translates in direction 128b, it becomes situated in a securing position C, with the latch 118 engaging flat end 114fb of catch 114. Securing resilient member 122 is now situated in a retaining position Y, with catch 114f on guide 114 secured between latch 118 and securing resilient member 122. The chassis component 108 is now secured in the chassis 100 through the contact of the latch 118 and the flat end 114fb of catch 114f on guide 114.

Referring now to FIGS. 2, 3, 4a, 4b, 4c, 5a, 5b, 6a, 6b, 6c, 8a, 8b, 8c, 8 and 8e, in releasing operation the chassis component 108 begins secured in the chassis 100 by the latches 118. The handles 120 are actuated in direction 128a, resulting in the latches 118 translating in the direction 128a. Operation of the latches 118 is substantially identical and will be described with respect to the latch 118 biased into the component channel 106c and interacting with guide 114. As the latch 118 translates in the direction 128a, the latch 118 begins to disengage flat end 114fb of catch 114f, resulting in latch 118 being situated in an intermediate position D and securing resilient member 122 being situated in position X. As the handle 120 continues to be actuated in direction 128a and latch 118 is translated in direction 128a, latch 118 fully disengages flat end 114fb of catch 114f and securing resilient member 122 becomes situated in a release position Z, with release surface 122c of securing resilient member 122 engaging catch 114f. With release surface 122c of securing resilient member 122 engaging catch 114f, the latch 118 is held in a release position E through the contact of the securing resilient member 122 and the catch 114f on guide 114. Chassis component 108 is now released from latches 118, but chassis component 108 does not need to be removed from the chassis 100 immediately. When the chassis component 108 must be removed, the chassis component 108 is translated in a direction 130, resulting in the guide 114 translating in a direction 130. During translation of the guide 114, beveled surface 118a engages arcuate surface 114fa due to the biasing force of biasing resilient member 124. Further translation of the guide 114 allows latch 118 to be biased back to position A with beveled surface 118a and securing resilient member 122 in the area adjacent the component channel 106c. The guide 114 may then be removed from the component channel 106c by disengaging the guide channel 114c and the component channel 106c, and the chassis component 108 may be removed from the chassis 100.

It is understood that variations may be made in the foregoing without departing from the scope of the disclosed embodiments. Furthermore, the elements and teachings of the various illustrative embodiments may be combined in whole or in part some or all of the illustrative embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for securing and releasing a chassis component comprising:
   a latch including a beveled surface, the latch operable to translate along an axis, the latch also defining a plurality of mounting holes operable to mount the latch to a chassis while permitting the latch to translate along the axis;
   a first resilient member coupled to the latch, the first resilient member operable to bias the latch in a latching position along the axis; and
   a second resilient member coupled to the latch and adjacent the beveled surface, whereby upon a first translating motion of the latch the second resilient member is moved to a retaining position, and upon a second translating motion of the latch the second resilient member is moved to a release position.

2. The apparatus of claim 1 wherein the latch includes a release handle operable to translate the latch on the axis in the second translating motion.

3. The apparatus of claim 1 wherein the latch includes a first end and a second end opposite the first end, the first end including the beveled surface and the second resilient member, and the second end coupled to the first resilient member.

4. The apparatus of claim 1 wherein the first resilient member is a coil spring.

5. The apparatus of claim 1 wherein the second resilient member is a leaf spring.

6. A computer comprising:
   a chassis;
   a latch including a beveled surface moveably coupled to the chassis, the latch operable to translate along an axis, the latch also defining a plurality of mounting holes operable to mount the latch to a chassis while permitting the latch to translate along the axis;
   a first resilient member coupled to the latch and the chassis, the first resilient member operable to bias the latch in a latching position along the axis; and
   a second resilient member coupled to the latch and adjacent the beveled surface, whereby upon a first translating motion of the latch the second resilient member is moved to a retaining position, and upon a second translating motion of the latch the second resilient member is moved to a release position.

7. The computer of claim 6 further comprising:
a chassis component operable to be secured in the chassis; and
a guide coupled to the chassis component, the guide including an catch operable to translate the latch on the axis in the first translating motion through contact with the beveled surface.

8. The computer of claim 6 wherein the latch includes a release handle operable to translate the latch on the axis in the second translating motion.

9. The computer of claim 6 wherein the latch includes a first end and a second end opposite the first end, the first end including the beveled surface and the second resilient member, and the second end coupled to the first resilient member.

10. The computer of claim 6 wherein the first resilient member is a coil spring.

11. The computer of claim 6 wherein the second resilient member is a leaf spring.

12. An information handling system comprising:
a chassis;
a microprocessor mounted in the chassis;
a storage coupled to the microprocessor;
a chassis component operable to be secured in the chassis;
a guide coupled to the chassis component, the guide including an catch;
a latch including a beveled surface moveably coupled to the chassis, the latch also defining a plurality of mounting holes operable to mount the latch to the chassis while permitting the latch to translate along an axis in a first translating motion in response to contact of the beveled surface with the catch;
a first resilient member coupled to the latch and the chassis, the first resilient member operable to bias the latch in a latching position along the axis; and
a second resilient member coupled to the latch and adjacent the beveled surface, whereby upon the first translating motion of the latch the second resilient member is moved to engage a portion of the guide in a retaining position, and upon a second translating motion of the latch the second resilient member is moved to engage a portion of the guide in a release position.

13. The system of 12 wherein the latch includes a release handle operable to translate the latch on the axis in the second translating motion.

14. The system of 12 wherein the latch includes a first end and a second end opposite the first end, the first end including the beveled surface and the second resilient member, and the second end coupled to the first resilient member.

15. The system of 12 wherein the first resilient member is a coil spring.

16. The system of 12 wherein the second resilient member is a leaf spring.

17. A method for securing and releasing a chassis component comprising:
providing a chassis;
moveably coupling a latch to the chassis, the latch being resiliently urged to translate along an axis to a latching position;
providing the latch with a plurality of mounting holes operable to mount the latch to the chassis while permitting the latch to translate along the axis;
coupling a resilient member to the latch, the resilient member including a retaining position and a release position;
inserting a chassis component into the chassis;
securing the chassis component in the chassis by engaging and translating the latch and moving the resilient member into the retaining position; and
releasing the chassis component from the chassis by translating the latch and moving the resilient member into the release position.

* * * * *